United States Patent [19]

Kira

[11] Patent Number: 4,732,842

[45] Date of Patent: Mar. 22, 1988

[54] EXPOSURE METHOD OF SEMICONDUCTOR WAFER BY RARE GAS-MERCURY DISCHARGE LAMP

[75] Inventor: Takehiro Kira, Kobe, Japan

[73] Assignee: Ushio Denki Kabushiki Kaisha, Tokyo, Japan

[21] Appl. No.: 761,682

[22] Filed: Aug. 2, 1985

[30] Foreign Application Priority Data

Feb. 19, 1985 [JP] Japan .................................. 60-29292

[51] Int. Cl.⁴ .............................................. G03C 5/00
[52] U.S. Cl. .................................... 430/311; 430/394; 430/396; 313/571; 313/639; 313/642; 315/158; 355/53
[58] Field of Search ............... 430/311, 394, 396, 327; 313/639, 642, 571; 315/151, 158, 159; 355/69, 53

[56] References Cited

U.S. PATENT DOCUMENTS

| | | | |
|---|---|---|---|
| 2,707,247 | 4/1955 | Anderson | 313/571 |
| 4,040,736 | 8/1977 | Johannsmeier | 355/43 |
| 4,117,375 | 9/1978 | Bachur et al. | 315/151 |
| 4,155,025 | 5/1979 | Dobrusskin et al. | 313/229 |
| 4,565,768 | 1/1986 | Nonogaki et al. | 430/197 |

OTHER PUBLICATIONS

Thompson et al., Introduction to Microlithography, American Chemical Society, Washington, D.C., 1983.
Elenbaas, High Pressure Mercury Vapor Lamps . . . , Phillips Technical Library, Netherlands, 1965.

Primary Examiner—John E. Kittle
Assistant Examiner—José G. Dees
Attorney, Agent, or Firm—Robert F. Ziems

[57] ABSTRACT

A semiconductor wafer one side of which has been coated with an ultraviolet sensitive material is exposed to light radiated from a rare gas-mercury discharge lamp. A rare gas-mercury discharge lamp filled with a rare gas such as xenon and mercury as principal luminous components thereof and capable of radiating light having the maximum peak wavelength at 365 nm is used as the lamp, and the coated side of the wafer is exposed, through a lens system having a high transmittance for light having a wavelength of 365 nm and a photomask, to the light radiated from the lamp so as to print a reduced image of the mask pattern on the coated side of the wafer. Use of the above-described rare gas-mercury discharge lamp allows to print a highly-integrated pattern having a narrow linewidth efficiently and in shorter exposure time owing to its high radiation intensity at 365 nm.

4 Claims, 12 Drawing Figures

EXPOSURE METHOD OF SEMICONDUCTOR WAFER BY RARE GAS-MERCURY DISCHARGE LAMP

BACKGROUND OF THE INVENTION (1) Field of the Art

This invention relates to a method for subjecting, for example, a semiconductor wafer to exposure through a photomask bearing a pattern drawn thereon by making use of UV light.

(2) Description of the Prior Art

Upon fabrication of semiconductor devices such as integrated circuits (ICs), large-scale integrated (LSI) circuits and very-large-scale integrated (VLSI) circuits, and the like, photoetching is carried out, for example, to remove parts of silicon dioxide layers provided on the surfaces of substrates formed of silicon wafers in accordance with desired patterns such as circuit patterns. This photoetching process generally requires such steps as forming a photoresist film on a silicon dioxide layer on a silicon substrate and then transferring mask features to the photoresist film by UV light. Subsequent to the exposure, the photoresist film is developed and the silicon dioxide film is subjected to an etching treatment. Thereafter, a further processing for the formation of a circuit such as diffusion or ion implantation is applied to the silicon substrate through the etched and exposed areas of the silicon dioxide layer.

A semiconductor wafer is usually circular. Its surface area is divided into minute sites arrayed in rows and columns. These minute sites are eventually cut from one another into chips which make up individual semiconductor devices. The diameters of semiconductor wafers are usually 3 inches, 5 inches, 6 inches or so. They however tend to become larger as their fabrication technique advances.

The resist-coated surface of a semiconductor wafer may be exposed at once in its entirety to light so as to print pattern images on all the numerous minute sites thereof at the same time. This exposure method is however accompanied by such problems that it requires a large-output mercury vapor lamp, thereby making the exposure system inevitably large, that technique of a considerably high level is also indispensable to ensure uniform illuminance on the whole exposed area of each semiconductor wafer, and that a semiconductor wafer becomes more susceptible to warping and the focusing operation of a projected image thus becomes more difficult as the semiconductor wafer becomes larger. Consequently, the above exposure method has difficulty in meeting the recent trend toward larger semiconductor wafers.

With the foregoing in view, the so-called stepwise exposure method has recently been proposed. According to the stepwise exposure method, the minute sites arrayed in rows and columns on the resist-coated surface of a semiconductor wafer are successively exposed one by one so that patterns are successively printed on the minute sites. This stepwise exposure method has brought about such significant advantages that inter alia, it permits use of a small-output mercury vapor lamp and hence a small exposure system because it is necessary to expose only a small area equivalent to one of the minute sites in each exposure, uniform illuminance can be readily achieved on the exposed area of the semiconductor wafer because the sites subjected respectively to successive exposure operation are small, and the focusing of projected images can be attained with ease in every exposure operation since the site exposed in each exposure operation is small and is less affected by the warping of the semiconductor wafer. Consequently, the stepwise exposure method permits with high accuracy the printing of patterns.

It is simple and advantageous to use a reducing and projecting lens system as an exposing optical system for printing a reduced image of a mask pattern on a semiconductor wafer. This reducing and projecting lens system is used by disposing it in the optical path which extends from an exposing light source to the semiconductor wafer. Conventionally-employed reducing and projecting lens systems generally have high transmittances for light of 436 nm. Reflecting this, supervoltage mercury vapor lamps capable of radiating light whose peak wavelength is also 436 nm have also been used as exposing light sources.

Reflecting the ever-increasing demand toward semiconductor devices of still higher integration degrees in recent years, it is necessary to make linewidths of patterns to be printed still finer and hence to improve the resolutions of exposure systems still further. In conventionally-employed supervoltage mercury vapor lamps, the wavelengths of the maximum peaks of their radiant lights are primarily 436 nm so that they match the light transmittances of reducing and projecting lens systems which have conventionally been employed. When radiant light of such characteristics is used for exposure, the minimum line width which can be resolved is limited to 1 μm or so. In order to improve the resolution still further, it is indispensable to make the wavelength of the maximum peak of radiant light still shorter.

However, no reducing and projecting lens system capable of permitting efficient transmission of short-wavelength light shorter than 436 nm has been available until lately. Fo the lack of such lens system, an exposure method has been developed to expose at once the entire exposure area of a semiconductor wafer by using an optical system which was constructed to reflect short-wavelength light efficiently by combining mirrors without relying upon any lens system. Such a method is however accompanied by a problem that the structure of the optical system becomes unavoidably complex.

Very lately, lenses permitting efficient transmission of short-wavelength light of 365 nm have been developed. Under the circumstances, it has become feasible to improve the resolution by using a reducing and projecting lens system. However, conventional supervoltage mercury vapor lamps which have been used as light sources for exposure were too low in the radiation efficiency of short-wavelength light of 365 nm and were not able to achieve efficient exposure.

SUMMARY OF THE INVENTION

With the foregoing in view, the present invention has as its object the provision of an exposure method of a semiconductor wafer by a rare gas-mercury discharge lamp, which can print sharply and efficiently a reduced image of a highly-integrated pattern on a semiconductor wafer by using a reducing and projecting lens system.

In one aspect of this invention, there is thus provided a method for exposing by a rare gas-mercury discharge lamp a semiconductor wafer one side of which has been coated with an ultraviolet sensitive material. A rare gas-mercury discharge lamp filled with a rare gas such as xenon and mercury as principal luminous components thereof and capable of radiating light having the maximum peak wavelength at 365 nm is used as the lamp, and the coated side of the wafer is exposed, through a lens system having a high transmittance for light having a wavelength of 365 nm and a photomask, to the light radiated from the lamp so as to print a reduced image of the mask pattern on the coated side of the wafer.

According to the above method of this invention, a reduced image of a highly-integrated pattern can be sharply and efficiently printed on a semiconductor wafer.

The above and other objects, features and advantages of the present invention will become apparent from the following description and the appended claims, taken in conjunction with the accompanying drawings.

DETAILED DESCRIPTION OF THE INVENTION AND PREFERRED EMBODIMENTS

Figure 1:
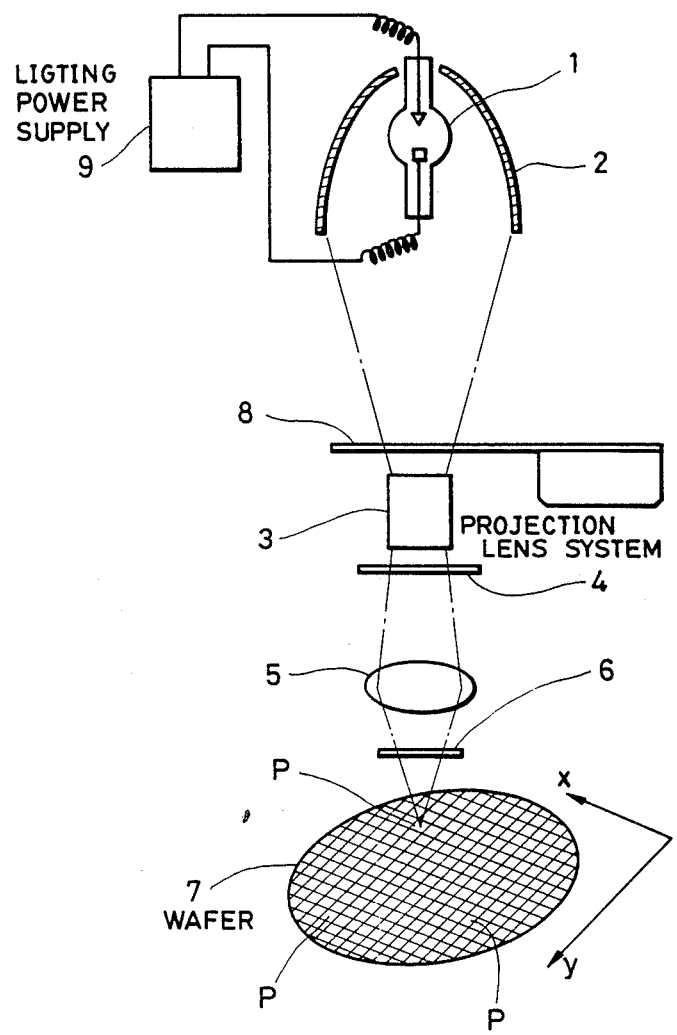
FIG. 1 is a simplified schematic illustration showing one example of exposure systems for semiconductor wafers.

FIG. 1 illustrates the outline of an exposure system for semiconductor wafers, to which the method of this invention is applied. In FIG. 1, numeral 1 indicates a xenon-mercury discharge lamp as a light source for exposure. The xenon-mercury discharge lamp 1 is disposed in such a way that its arc is located at the focal point of a light-focusing mirror 2. Light which has been emitted from the xenon-mercury discharge lamp 1 is collected by the light-focusing mirror 2 and is then projected, by way of a projection lens system 3, bandpass filter 4 and reducing and image-forming condenser lens 5, onto a photomask 6 on which a circuit pattern is drawn. An optical image of the photomask 6 is thereafter projected onto a semiconductor wafer 7, which is held on a susceptor (not illustrated) and carries a photoresist film composed of an ultraviolet sensitive material and applied on the upper surface thereof. Thus, a circuit pattern corresponding to the photomask 6 is printed on a reduced scale on the semiconductor wafer 7.

The xenon-mercury discharge lamp 1 is filled, for example, with 0.1–5 atmos (at room temperature) of xenon and mercury in an amount within the range of 1–30 mg per cc (at room temperature) of the interior space of the envelope of the discharge lamp, both as principal luminous components. The wavelength of the maximum peak of light radiated from the discharge lamp is 365 nm. Furthermore, lenses of the projection lens system 3 and the reducing and image-forming condenser lens 5 are all made of a glass material having a high transmittance for light having a wavelength of 365 nm. Specifically, the lenses of the projection lens system 3 and the reducing and image-forming lens 5 make use of silica glass which has a high transmittance for light having a wavelength of 365 nm. The bandpass filter 4 is formed of a glass material having a high transmittance for light having a wavelength of 365 nm. The bandpass filter 4 allows light of a narrow wavelength range including the peak wavelength to pass with a high transmittance for 90% or higher for example, but does not allow any substantial passage of light components having wavelengths unnecessary for exposure.

In one embodiment of this invention, the exposure of a semiconductor wafer is carried out in the following manner. Taking the system illustrated in FIG. 1 by way of example, the xenon-mercury discharge lamp 1 is continuously lit with constant power so that its power consumption is controlled, for example, equal to its rated power consumption. Then, the exposure-controlling shutter 8 is repeatedly opened and closed so as to irradiate through the photomask 6 each of the minute sites of the semiconductor wafer for a predetermined time period at the exposure point with the light radiated from the xenon-mercury discharge lamp 1, thereby performing the exposure of the semiconductor wafer.

Figure 2:
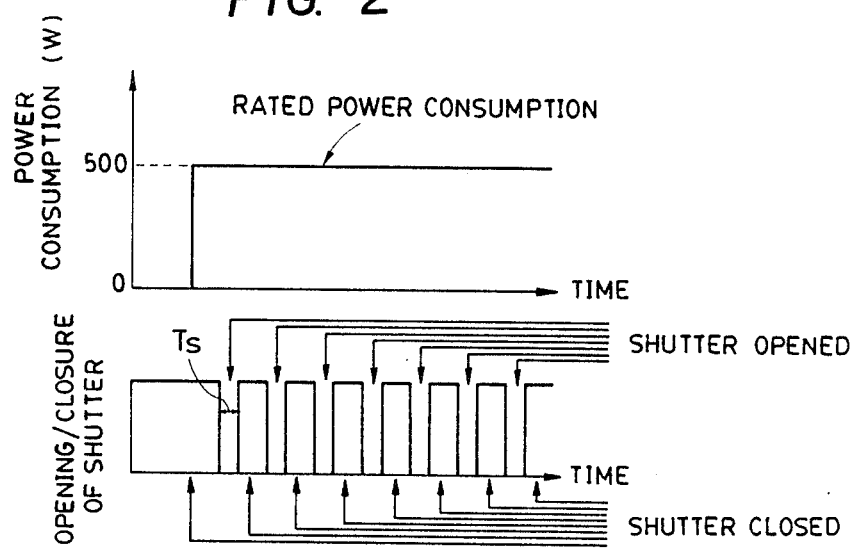
FIG. 2 is a diagrammatic illustration showing the relationship between the waveform of consumed electric power and the opening/closing operation of a shutter in one embodiment of this invention.

The degree of exposure of the semiconductor wafer 7 can be controlled to a predetermined level by making suitable setting as to the the opening time period of the shutter 8. The opening/closing operation of the shutter 8 may be controlled in such a way that as illustrated in FIG. 2 for example, the light radiated from the xenon-mercury discharge lamp 1 is shut off by the shutter 8 to prevent irradiation of light to the semiconductor wafer 7 always except for the exposing time periods and the opening time period $T_s$ of the shutter 8 is set at a constant value, for example, within the range of 100–400 msec.

The coated side of the semiconductor wafer 7 is divided into a number of minute sites P arranged in rows and columns. These minute sites P are shifted stepwise one after another to the exposure point by shifting them in both x-direction and y-direction which is perpendicular to the x-direction. The exposure of each minute site P is effected while holding the minute site P during a brief time at the exposure point. By opening and closing the shutter 8, a single exposure operation is completed to print a pattern to one of the minute sites P of the semiconductor wafer 7. Then, while the shutter 8 is closed, the semiconductor wafer 7 is shifted stepwise so that another minute site P, which is to be exposed next, is brought to the exposure point. In the same manner, the exposure is repeated.

Figure 3:
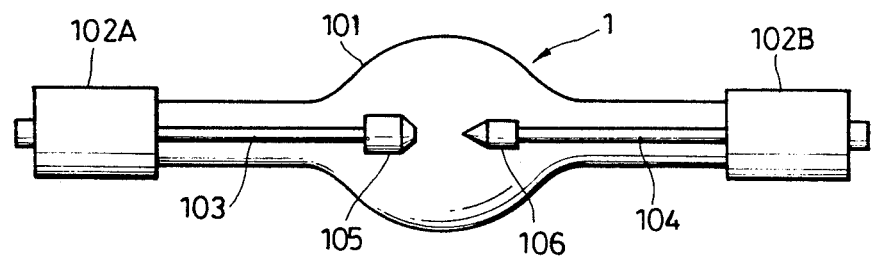
FIG. 3 is a schematic illustration of one example of xenon-mercury discharge lamps.

FIG. 3 shows one example of the specific structure of the xenon-mercury discharge lamp 1. In FIG. 3, there are illustrated an envelope 101 made of silica glass, bases 102A,102B, electrode stems 103,104, anode 105 and cathode 106. The envelope 101 is filled, for example, with 0.1-5 atmos (at room temperature) of xenon and with 1-30 mg of mercury per cc (at room temperature) of the interior space of the envelope, both as principal luminous components.

Figure 4:
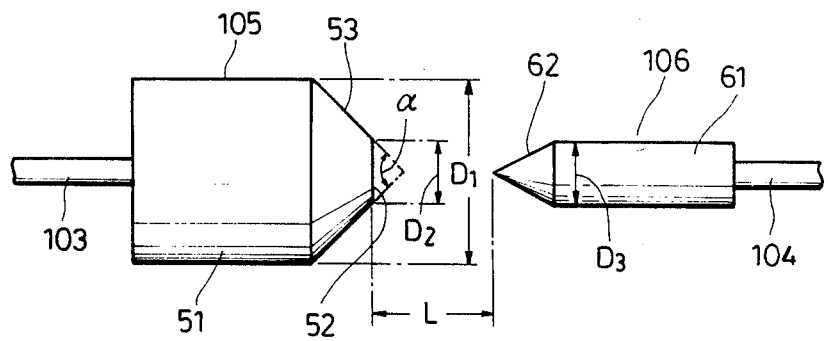
FIG. 4 is a schematic illustration showing, on an enlarged scale, some essential parts of the xenon-mercury discharge lamp of FIG. 3.

As shown in FIG. 4 on an enlarged scale, the anode 105 is composed of a large-diametered cylindrical base portion 51 and a tip portion 53 of frusto-conical shape extending frontward and inward from the base portion 51 and terminating in a flat end face 52. On the other hand, the cathode 106 is composed, as also shown in FIG. 4 on an enlarged scale, of a rod-like portion 61 and a cone-shaped head portion 62 extending from the rod-like portion 61.

One example of the specific design of the xenon-mercury discharge lamp 1 will next be given.
Rated power consumption: 500 W (25 V, 20 A)
Shape of the anode:
  Outer diameter $D_1$ of the base portion 51: 6 mm
  Diameter $D_2$ of the flat end face 52: 2 mm
  Opening angle $\alpha$ of the tip portion 53: 90°
Shape of the cathode:
  Outer diameter of the rod-like portion 61: 2.5 mm
  Interelectrode distance L: 3.0 mm
Principal luminous components (at room temperature):
  Xenon: 3 atmos
  Mercury: 7 mg per cc of the interior space of the envelope Owing to the inclusion of a rare gas of xenon at the specific pressure and mercury in the specific amount as principal luminous components, the xenon-mercury discharge lamp 1 has a high radiation intensity at 365 nm and permits printing of narrow linewidths and a reduction to the exposure time. In addition, the radiation intensities of light having wavelengths respectively on the shorter and longer wavelength sides relative to 365 nm are lowered sharply, resulting in a narrow full pulse width at half maximum of a pulse having its peak at 365 nm. This has led to smaller chromic aberration in the lens system and greater depth of focus, thereby facilitating the focusing work. Unlike the xenon-mercury discharge lamp 1, conventional supervoltage mercury vapor lamps have lower radiation intensities at 365 nm compared with their radiation intensities at 436 nm. If one tries to use light of 365 nm with a view toward effecting the printing of a highly-integrated pattern, it will not be feasible to make any efficient use of light radiated from such conventional lamps. As a matter of fact, the present inventors conducted an experiment to investigate the radiation characteristics of conventional supervoltage mercury vapor lamps by changing the amount of filled mercury. When the amount of filled mercury was reduced in order to lower the mercury pressure during the lighting period, the radiation intensities were lowered all over the radiation wavelength ranges. Although the amount of filled mercury was conversely increased to make the mercury pressure greater during the lighting period, the radiation intensity at 365 nm remained still low within such a mercury content range that the envelope did not burst. Consequently, it was hard to make the radiation intensity at 365 nm higher with the supervoltage mercury vapor lamp. Accordingly, the present inventors proceeded with another experiment to investigate the radiation characteristics by changing the kinds and amounts of filled gases which served as principal luminous components. As a result, it has been found that a rare gas-mercury discharge lamp filled, for example, with 0.1-5 atmos (at room temperature) of xenon and with 1-30 mg of mercury per cc (at room temperature) of the interior space of the envelope has a high radiation intensity at 365 nm and moreover a sharp radiation peak at 365 nm.

Figure 5:
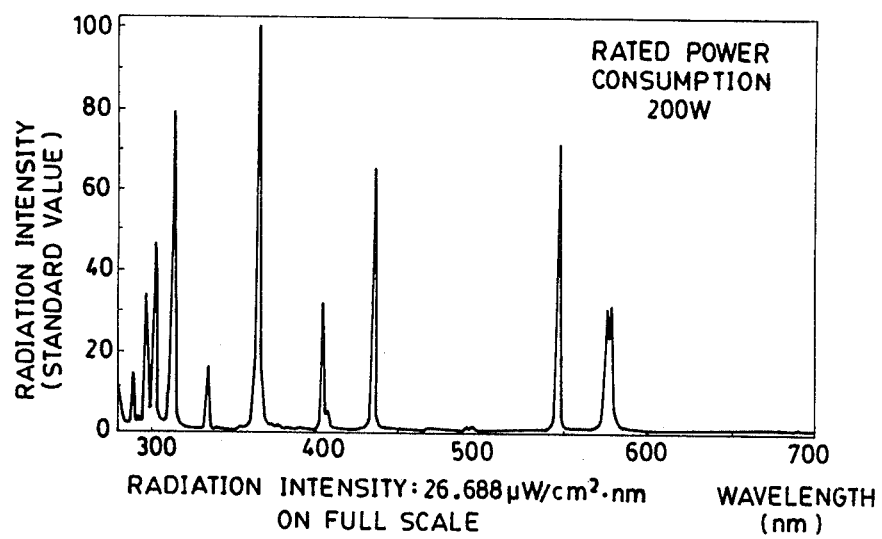
FIGS. 5, 6 and 7 are spectral characteristic diagrams illustrating radiation characteristics of xenon-mercury discharge lamps having rated power consumptions of 200 W, 500 W and 750 W respectively, which are useful in the practice of this invention.
Figure 8:
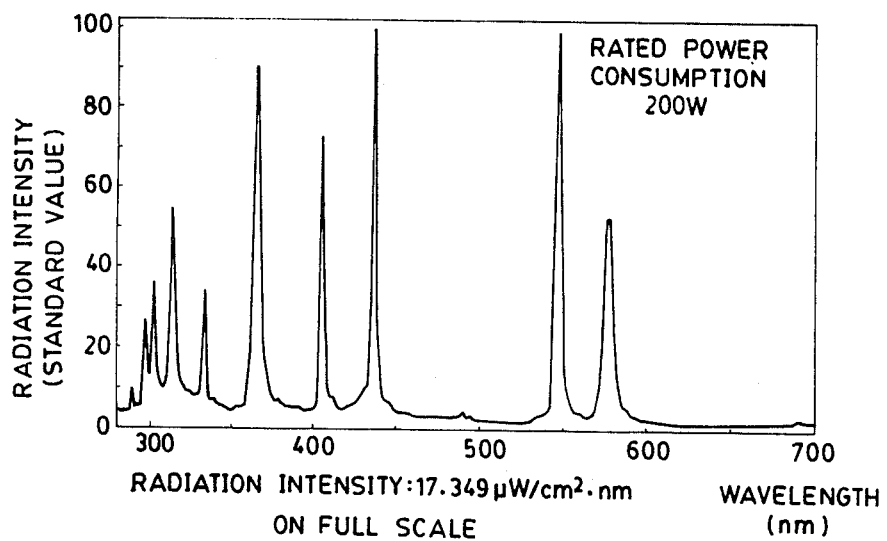
FIGS. 8, 9 and 10 are spectral characteristic diagrams illustrating radiation characteristics of conventionally-employed supervoltage mercury vapor lamps having rated power consumptions of 200 W, 500 W and 750 W respectively.
Figure 6:
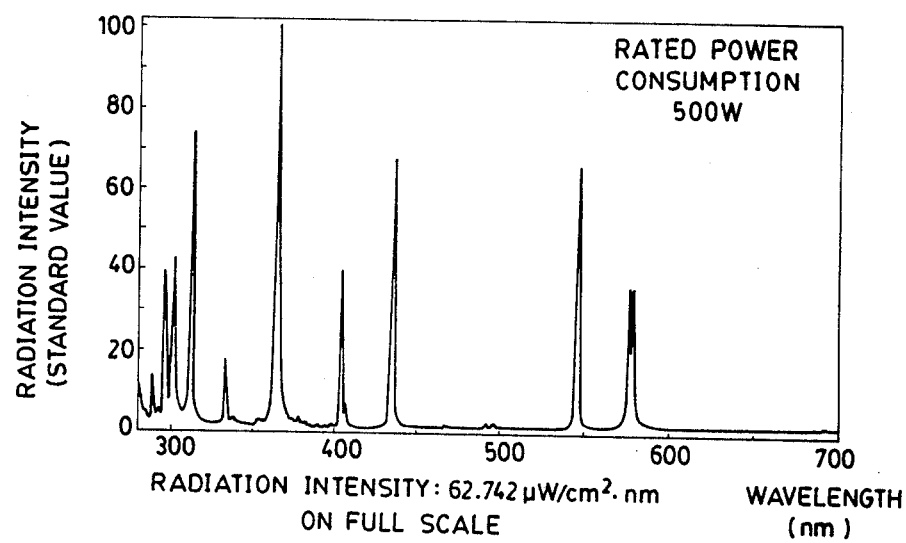
Figure 9:
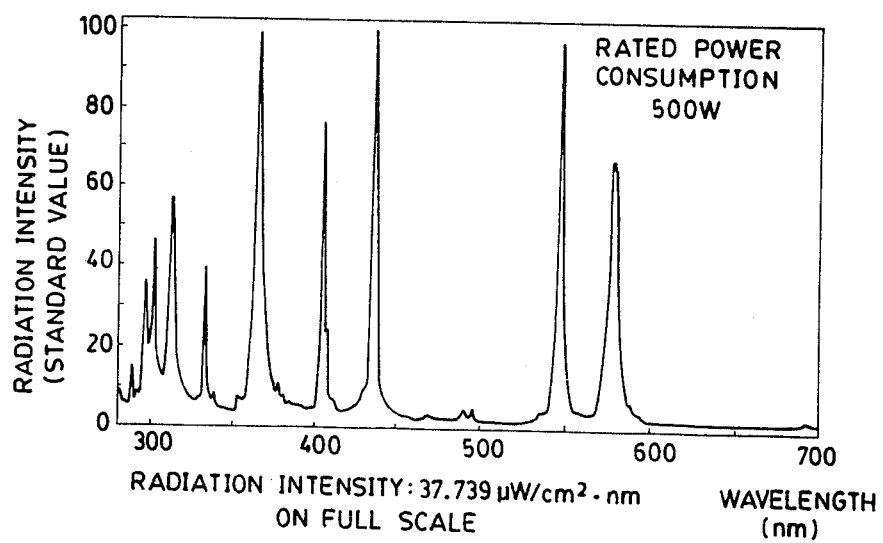
Figure 7:
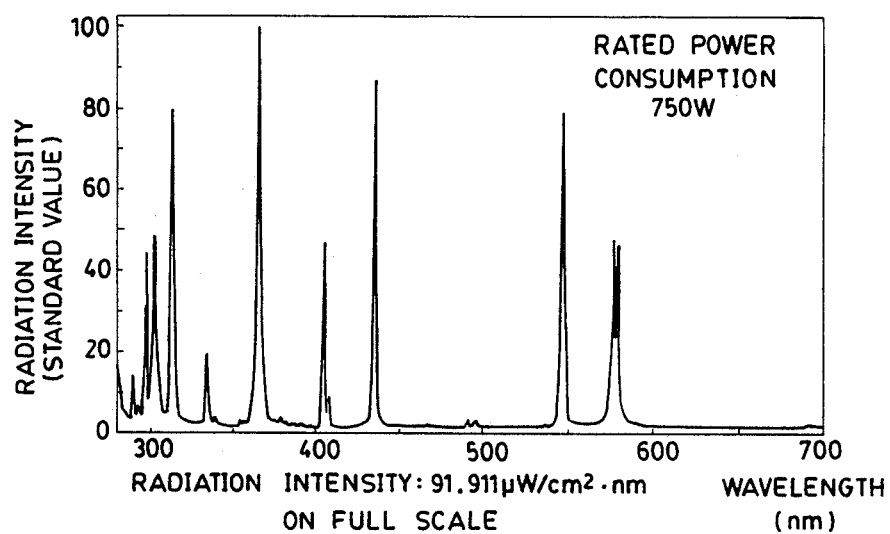
Figure 10:
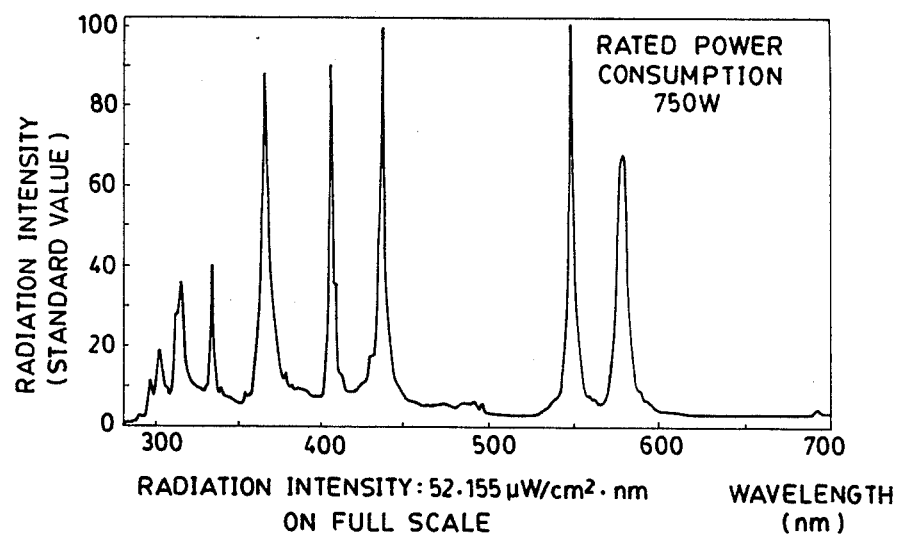

FIGS. 5, 6 and 7 are spectral characteristic diagrams showing the radiation characteristics of xenon-mercury discharge lamps which are useful in the practice of this invention and have rated power consumptions of 200 W, 500 W and 750 W respectively. On the other hand, FIGS. 8, 9 and 10 are spectral characteristic diagrams showing the radiation characteristics of conventional supervoltage mercury vapor lamps, the rated power consumptions of which are respectively 200 W, 500 W and 750 W. In FIGS. 5-10, the respective curve shows the intensity of radiation at a point 1 m from the lamp. These figures are now compared. As also shown in Table 1 which will be given herein, the xenon-mercury discharge lamps useful in the practice of this invention have radiation intensities at 365 nm, which are higher by about 1.7-2.3 times than those of the conventional mercury vapor lamps. Furthermore, the full pulse widths at half maximum of pulses having their peaks at 365 nm of the discharge lamps are smaller, i.e., about 0.7-0.8 times those of the vapor lamps. Hence, the discharge lamps have sharp peaks at 365 nm. Moreover, the radiation intensities of the discharge lamps for the ranges other than the peak ranges are rather smaller, namely, about ½ of those of the vapor lamps. Consequently, by effecting the exposure of the semiconductor wafer 7 in such a manner that a reduced image of a mask pattern is projected onto the semiconductor wafer 7 through a lens system having a high transmittance for light having a wavelength of 365 nm while using one of such rare gas-mercury discharge lamp as a light source for exposure, it is possible to increase the resolution up to 0.8 μm for effecting the printing of a highly-integrated pattern and also to shorten the time required for the printing to about 0.5-0.6 times compared with conventional exposure methods, thereby permitting efficient exposure.

TABLE 1

| Rated power consumption (W) | Wavelength (nm) | Radiation intensity ($\mu W/cm^2 \cdot nm$) | | Ratio in radiation intensity |
|---|---|---|---|---|
| | | Supervoltage mercury vapor lamp | Xenon-mercury discharge lamp | |
| 200 | 365 | 15.5 | 26.7 | 1.7 |
| | 436 | 17.3 | 17.4 | 1.0 |
| 500 | 365 | 34.7 | 62.7 | 1.8 |
| | 436 | 37.7 | 42.4 | 1.1 |
| 750 | 365 | 39.8 | 91.9 | 2.3 |
| | 436 | 51.7 | 79.5 | 1.5 |

In Table 1, the "supervoltage mercury vapor lamp" is a conventional supervoltage mercury vapor lamp, whereas the "xenon-mercury discharge lamp" is a xenon-mercury discharge lamp useful in the practice of this invention. The term "ratio in radiation intensity" is a value which indicates how many times the intensity of radiation of each of the xenon-mercury discharge lamps useful in the practice of this invention is higher at a point apart by 1 m from the lamp compared with the radiation intensity of its corresponding conventional supervoltage mercury vapor lamp.

Using a semiconductor wafer exposure system including a rare gas-mercury discharge lamp of such a construction as described above, exposing of a reduced image of a circuit pattern was actually carried out onto a silicon wafer by the stepwise exposure method under such conditions that the time period $T_S$, during which the shutter 8 is kept open, is controlled at a constant time of 200 msec. while lighting the xenon-mercury discharge lamp with a constant power consumption, namely, its rated power consumption of 500 W. The above exposure was able to print a highly-integrated circuit pattern having a minimum linewidth of 0.8 μm with a high degree of sharpness.

Figure 11A:
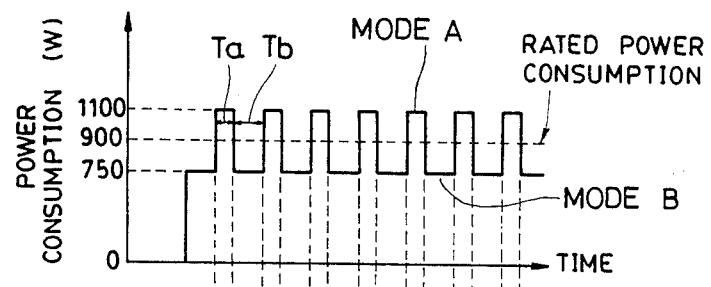
FIGS. 11(a) and 11(b) are diagrammatic illustrations showing respectively the waveform of consumed power and the opening/closing operation of a shutter in another embodiment of this invention.

Another embodiment of this invention will next be described, in which the exposure of a semiconductor wafer will be carried out in the following manner. In an exposure system illustrated, for example, in FIG. 1, the xenon-mercury discharge lamp 1 is continuously fed with power so that it is lit continuously. The power to be supplied to the xenon-mercury discharge lamp 1 is then controlled by a lighting power supply 9, for example, as shown in the form of the waveform of consumed power in FIG. 11(a), thereby periodically repeating a high-level mode A, in which the power consumption of the xenon-mercury discharge lamp 1 is at a high level, for example, at a level about 1.3–2.5 times the rated power consumption of the xenon-mercury discharge lamp, and a low-level mode B in which the power consumption of the xenon-mercury discharge lamp 1 is at a low level, for example, at the rated power consumption level or a level close to the rated power consumption level. During each high-level mode A, the shutter 8 is opened and closed so that the light radiated from the xenon-mercury discharge lamp 1 is caused to irradiate, for a pre-determined time and through the photomask 6, one of the minute sites P of the semiconductor wafer 7 which minute site P is located at the exposure point.

Figure 11B:
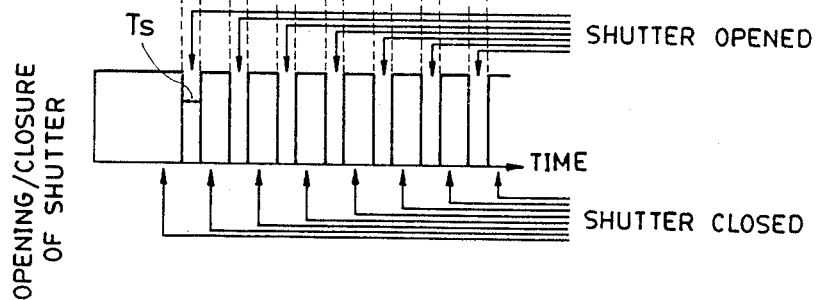

The degree of exposure of the semiconductor wafer 7 can be controlled to a required level by holding the shutter 8 for a predetermined time period in its opened position while the xenon-mercury discharge lamp 1 is lit in the mode A during which the power consumption is at the high level. As illustrated by way of example in FIG. 11(b), the opening/closing operation of the shutter 8 may be controlled in such a way that the time period $T_s$, during which the shutter 8 is kept open in each mode A of the high power consumption level, is maintained at a constant value, for example, within the range of 100–400 msec. The time period $T_a$ of each mode A of the high power consumption level is controlled at a constant value, for example, within the range of 200–400 msec., while the time period $T_b$ of each mode B of the low power consumption level is controlled at a constant level of about 400 msec. for example.

The exposure of the semiconductor wafer 7 is carried out by shifting its minute sites P stepwise one after another successively to the exposure point and then exposing them successively to the light while holding them at the exposure point during a brief time. By opening and then closing the shutter 8, a single exposure operation is completed so that a pattern is printed on one of the minute sites P of the semiconductor wafer 7. While the shutter 8 is closed, the semiconductor wafer 7 is shifted stepwise so that another minute site P, which is to be exposed next, reaches the exposure point. The exposure work is then repeated in the same manner.

Using a semiconductor wafer exposure system having the structure shown in FIG. 1 and equipped with a xenon-mercury discharge lamp having the same structure as that mentioned above and a rated power consumption of 900 W, a circuit pattern was irradiated onto the silicon wafer by the stepwise exposure method under such conditions that the lighting state of the xenon-mercury discharge lamp is controlled in such a way that the power consumption in each mode A was 1100 W, the time period $T_a$ in each mode A was 200 msec., the power consumption in each mode B was 750 W and the time period $T_b$ in the mode B was 400 msec., and the shutter-opening time period $T_s$ was kept constant, i.e., for 180 msec. in each mode A. It was possible to print a highly-integrated circuit pattern of a minimum linewidth of 0.8 μm. In addition, it required a shorter time period for the printing and hence improved the processing efficiency. Furthermore, the xenon-mercury vapor lamp wasted less electric power and thus provided greater power-saving effects.

Besides, the above exposure method has also brought about the following advantageous effects. Even while the light radiated from the xenon-mercury discharge lamp is not used for exposure, the xenon-mercury discharge lamp is still lit in the mode B in which the power consumption is at the low level. It is thus possible to reduce significantly the wasting of electric power by the xenon-mercury discharge lamp and also to avoid the overheating and damage of the shutter. Moreover, it is possible to use, as the xenon-mercury discharge lamp, a xenon-mercury discharge lamp the rated power consumption of which is equal to the smaller power consumption in the mode B of the low level. In the mode A of the high level, the power consumption of the xenon-mercury discharge lamp is increased. Therefore, the xenon-mercury discharge lamp can effect the exposure to a needed degree. Owing to this lighting manner, the exposure of each semiconductor wafer can be effected successfully by means of a small xenon-mercury discharge lamp. As a result, the space required for the installation of the exposure system is reduced, thereby lowering the cost required for the maintenance of a clean room in which the exposure system is installed, and hence making it possible to make significant reduction to the fabrication costs of semiconductor devices.

Use of the above-described xenon-mercury discharge lamp allows to print a highly-integrated pattern having a narrow linewidth efficiently and in shorter exposure time owing to its high radiation intensity at 365 nm.

In the present invention, it may be possible to use a rare gas-mercury discharge lamp filled with a rare gas other than xenon such as argon and/or krypton with and/or without xenon and mercury as principal luminous components and capable of radiating light having the maximum peak wavelength at 365 nm.

Having now fully described the invention, it will be apparent to one of ordinary skill in the art that many changes and modifications can be made thereto without departing from the spirit or scope of the invention as set forth herein.

What is claimed is:

1. In a method for producing with high resolution a pattern image on a semiconductor wafer, one side of which has been coated with an ultraviolet sensitive material, by exposing the wafer to light emitted from a discharge lamp, the improvement comprising:

filling the discharge lamp with 0.1–5 atmospheres of xenon at room temperature and with 1–30 milligrams of mercury per cubic centimeter, at room temperature, of the interior space of the envelope of said discharge lamp;

radiating from the lamp light having a peak wavelength at 365 nm;

projecting said light through a lens system having a high transmittance for light having a wavelength of 365 nm, through a photomask defining a pattern and through a filter having a transmittance of at least 90% for light having a wavelength of 365 nm; and exposing the coated side of the semiconductor wafer to the projected light so as to print a reduced image of the photomask pattern on the coated side of the wafer wherein the minimum line width of the image is 0.8 μm.

2. The method claimed in claim 1, wherein the semiconductor wafer contains a plurality of minute sites to be exposed and the projected light defines an optical path, further comprising:

shifting the semiconductor wafer in increments from one of said minute sites to another in a direction perpendicular to the axis of the optical path of said projected light to successively expose said minute sites, and blocking the light radiated from the lamp by a shutter during the shifting.

3. The method as claimed in claim 1, wherein the projected light defines an optical path, further comprising:

operating the lamp alternately between a low power consumption level and a high power consumption level;

blocking the light from the lamp by an exposure-controlling shutter while the lamp operates at the low power consumption level;

and incrementally shifting the semiconductor wafer in a plane perpendicular to the optical path of the light radiated from the lamp during the step of blocking the light, so that the wafer is successively exposed from one minute site to another by the light radiated from the lamp while the lamp is operating at the high power consumption level.

4. In a method for producing with high resolution a pattern image on a semiconductor wafer, one side of which has been coated with an ultraviolet sensitive material, by exposing the wafer to light emitted from a discharge lamp, the improvement comprising;

filling the discharge lamp with fill consisting essentially of 0.1–5 atmospheres of zenon at room temperature and with 1–30 milligrams of mercury per cubic centimeter, at room temperature, of the interior space of the envelope of said discharge lamp;

radiating from the lamp light having a peak wavelength of 365 nm;

projecting said light through a lens system having a high transmittance for light having a wavelength of 365 nm, through a photomask defining a pattern and through a filter having a transmittance of at least 90% for light having a wavelength of 365 nm; and exposing the coated side of the semiconductor wafer to the projected light so as to print a reduced image of the photomask pattern on the coated side of the wafer wherein the minimum line width of the image is 0.8 μm.

* * * * *

UNITED STATES PATENT AND TRADEMARK OFFICE
CERTIFICATE OF CORRECTION

PATENT NO. : 4,732,842

DATED : March 29, 1988

INVENTOR(S) : Takehiro Kira

It is certified that error appears in the above-identified patent and that said Letters Patent is hereby corrected as shown below:

Claim 4, line 7, change "zenon" to --xenon--.

Signed and Sealed this

Ninth Day of August, 1988

Attest:

DONALD J. QUIGG

*Attesting Officer*  *Commissioner of Patents and Trademarks*